United States Patent
Bhat et al.

(10) Patent No.: US 10,739,411 B2
(45) Date of Patent: Aug. 11, 2020

(54) POWER ELECTRONIC TEST AUTOMATION CIRCUIT

(71) Applicant: FORD GLOBAL TECHNOLOGIES, LLC, Dearborn, MI (US)

(72) Inventors: Krishna Prasad Bhat, Canton, MI (US); Chingchi Chen, Ann Arbor, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 159 days.

(21) Appl. No.: 15/997,216

(22) Filed: Jun. 4, 2018

(65) Prior Publication Data

US 2019/0369167 A1     Dec. 5, 2019

(51) Int. Cl.
  *G01R 31/40*     (2020.01)
  *H02M 7/537*     (2006.01)

(52) U.S. Cl.
  CPC ............. *G01R 31/40* (2013.01); *H02M 7/537* (2013.01)

(58) Field of Classification Search
  CPC ................................ G01R 31/40; H02M 7/537
  USPC ..................................... 324/764.01, 537, 500
  See application file for complete search history.

(56) References Cited

U.S. PATENT DOCUMENTS

| | | | |
|---|---|---|---|
| 5,737,203 A * | 4/1998 | Barrett | H02M 3/33561 323/355 |
| 6,031,738 A * | 2/2000 | Lipo | H02M 7/487 363/37 |
| 6,556,034 B1 | 4/2003 | Johnson et al. | |
| 7,173,446 B2 | 2/2007 | Isakharov et al. | |
| 8,164,351 B2 | 4/2012 | Hashimoto | |
| 9,036,388 B2 * | 5/2015 | Komatsu | H02M 7/487 363/131 |
| 2007/0120560 A1 * | 5/2007 | Rempt | G01N 27/82 324/238 |
| 2011/0133732 A1 * | 6/2011 | Sauber | G01R 33/0023 324/251 |
| 2013/0265041 A1 * | 10/2013 | Friedrich | G01R 15/207 324/260 |
| 2019/0229639 A1 * | 7/2019 | Ueda | G05B 19/042 |

* cited by examiner

*Primary Examiner* — Giovanni Astacio-Oquendo
(74) *Attorney, Agent, or Firm* — Brooks Kushman PC; David Kelley

(57) ABSTRACT

A system for testing a phase leg of an inverter includes a load coupled to an output terminal of the phase leg. A test circuit includes a capacitor coupled between an inverter power input and a switch module operative to couple the capacitor to the load. The circuit further includes a switch operative to select a polarity of a voltage across the capacitor. The circuit also includes a pair of switching elements operative to selectively couple the first terminal to the inverter power input and the inverter power return. The components can be operated by a controller configured to selectively couple the load to the inverter power and return terminals, selectively charge and couple the capacitor to the load, and interface with the inverter to control a path of current flow through active and passive elements of the phase leg.

19 Claims, 2 Drawing Sheets

POWER ELECTRONIC TEST AUTOMATION CIRCUIT

TECHNICAL FIELD

This application generally relates to a circuit for testing power electronic devices.

BACKGROUND

Power semiconductor devices may be categorized as active or passive devices. Active power semiconductor devices include Insulated Gate Bipolar Transistors (IGBT) and Metal Oxide Semiconductor Field Effect Transistors (MOSFET). Passive power semiconductor devices include diodes. Active and passive semiconductor devices may be included in various circuit configurations. An electronics device may include both passive and active semiconductor devices. The circuit and devices may be subjected to various tests to quantify performance and test limits. Testing may include static tests (e.g., single-pulse test or I-V test), dynamic tests (e.g., double-pulse test), short circuit tests (e.g., shoot-through test), and breakdown tests (e.g., static and dynamic breakdown tests). The devices may be characterized under a variety of testing and operating conditions.

SUMMARY

A circuit includes a capacitor coupled between an inverter power input and a switch module operative to couple the capacitor to a first terminal of a load having a second terminal coupled to an inverter phase output. The circuit further includes a switch operative to select a polarity of a voltage across the capacitor. The circuit further switching elements operative to selectively couple the first terminal to each and only one of the inverter power input and an inverter power return.

The switch module may include a pair of Insulated Gate Bipolar Transistors (IGBT) that are arranged to, responsive to being in a conductive state, permit current flow in opposite directions. The switching elements may be a pair of relays. The circuit may further include a controller configured to interface with the switch module, the switch, the switching elements, and an inverter under test to selectively control a flow of current through active and passive elements of an inverter phase leg to which the circuit is connected. The controller may be configured to operate the switching elements such that no more than one is closed at a time. The controller may be further configured to interface with the inverter under test to operate active elements of the inverter phase leg during a test cycle. The capacitor may have a capacitance value greater than an inverter capacitance across the inverter power input and the inverter power return. The load may be configured to have a selectable inductance. The circuit may further include a diode electrically coupled between the inverter power input and one of the switching elements.

A system for testing an inverter phase leg having output, power, and return terminals includes a load coupled to the output terminal. The system further includes a controller configured to selectively couple the load to each and only one of the power terminal and the return terminal, selectively charge and couple a capacitor to the load, and interface with the inverter phase leg to control a current path through active and passive elements of the inverter phase leg.

The controller may be configured to drive a pair of Insulated Gate Bipolar Transistors (IGBT) that are coupled between a terminal of the capacitor and the load such that each of the pair of IGBTs is configured to permit current flow in opposite directions when driven to a conductive state. The controller may be configured to drive a relay that is electrically coupled between the power terminal and a terminal of the load. The controller may include a relay electrically coupled between the return terminal and a terminal of the load. The controller may be further configured to selectively connect a voltage source to adjust a voltage polarity with which the capacitor is charged. The load may be configured to have a selectable inductance and the controller is further configured to select an inductance value.

A circuit for testing an inverter phase leg having output, power, and return terminals includes a capacitor, a switch circuit coupling the capacitor to a first terminal of a load having a second terminal coupled to the output terminal, a switch operative to select a polarity of a voltage connected across the capacitor, and a pair of switches operative to selectively couple the first terminal to the power and return terminals.

The capacitor may have a capacitance value greater than an inverter capacitance connected across the power and return terminals internal to the inverter phase leg. The load may be configured to have a selectable inductance. The switch circuit may include a pair of Insulated Gate Bipolar Transistors (IGBT) configured to permit current flow in opposite directions when activated. The circuit may further include a controller configured to interface with the switch circuit, the switch, the pair of switches, and the inverter phase leg to selectively control a flow of current through active and passive elements of the inverter phase leg to which the circuit is connected.

DETAILED DESCRIPTION

Embodiments of the present disclosure are described herein. It is to be understood, however, that the disclosed embodiments are merely examples and other embodiments can take various and alternative forms. The figures are not necessarily to scale; some features could be exaggerated or minimized to show details of particular components. Therefore, specific structural and functional details disclosed herein are not to be interpreted as limiting, but merely as a representative basis for teaching one skilled in the art to variously employ the present invention. As those of ordinary skill in the art will understand, various features illustrated and described with reference to any one of the figures can be combined with features illustrated in one or more other figures to produce embodiments that are not explicitly illustrated or described. The combinations of features illustrated provide representative embodiments for typical applications. Various combinations and modifications of the features consistent with the teachings of this disclosure, however, could be desired for particular applications or implementations.

Characterizing power semiconductor devices and circuits with power semiconductor devices may require performing test cycles to exercise different parts of the circuit. To fully characterize the devices, tests may need to be performed under a variety of conditions. The tests may be performed with different voltages, currents, temperatures and switching rates. Further, a circuit under test may include both passive and active power semiconductor devices. A test circuit for characterizing and evaluating the performance of power semiconductor circuits and devices may be configured to permit variation of operating parameters to fully characterize the circuits. Further, the test circuit may be configured to improve the accuracy and reproducibility of the results.

Figure 1:
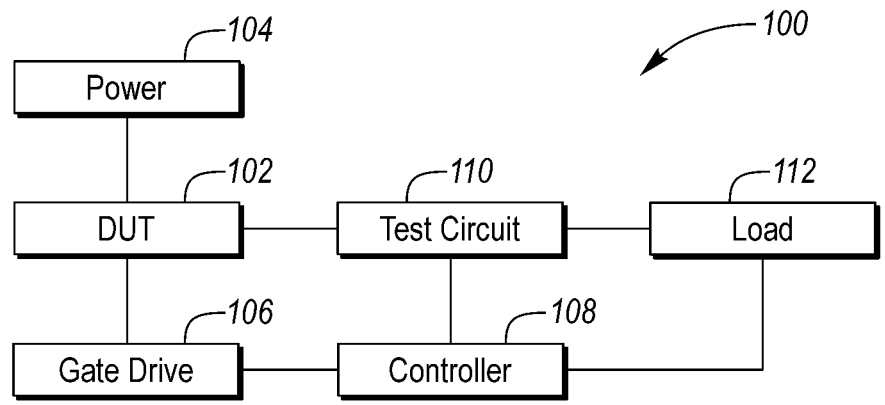
FIG. 1 is a possible configuration of a system for testing an inverter.

FIG. 1 depicts a possible configuration of a test system 100 for evaluating a device under test (DUT). The test system 100 may be configured to evaluate the performance and characterize a DUT 102. The test system 100 may include a power source 104 that is electrically coupled to the DUT 102. For example, the power source 104 may be a high-voltage DC power source. In some configurations, the power source 104 may be configured to have a selectable voltage and current capability. The test system 100 may further include a gate drive circuit 106. The gate drive circuit 106 may be configured to drive one or more gate inputs associated with one or more power semiconductor devices of the DUT 102. In some configurations, the gate drive circuit 106 may be included as a component within the DUT 102 and provide an interface to an external controller. An advantage of using the internal gate drive circuit of the DUT 102 is that the devices will be characterized in the manner it will be used and also reduces cost of the test system 100 as the gate drive circuitry is not reproduced. The test system 100 may further include a controller 108 that is configured to manage and control the test system 100.

The test system 100 may further include a circuit 110. The circuit 110 may include active and passive circuit components to operate the test system 100. The circuit 110 may be electrically couplable to the DUT 102 and include components that are controlled by signals from the controller 108. The test system 100 may further include a load 112 that is electrically coupled to the circuit 110. Further details and examples of the components of the test system 100 are provided herein. The circuit 110 may be configured to selectively electrically couple the load 112 to the DUT 102.

Figure 2:
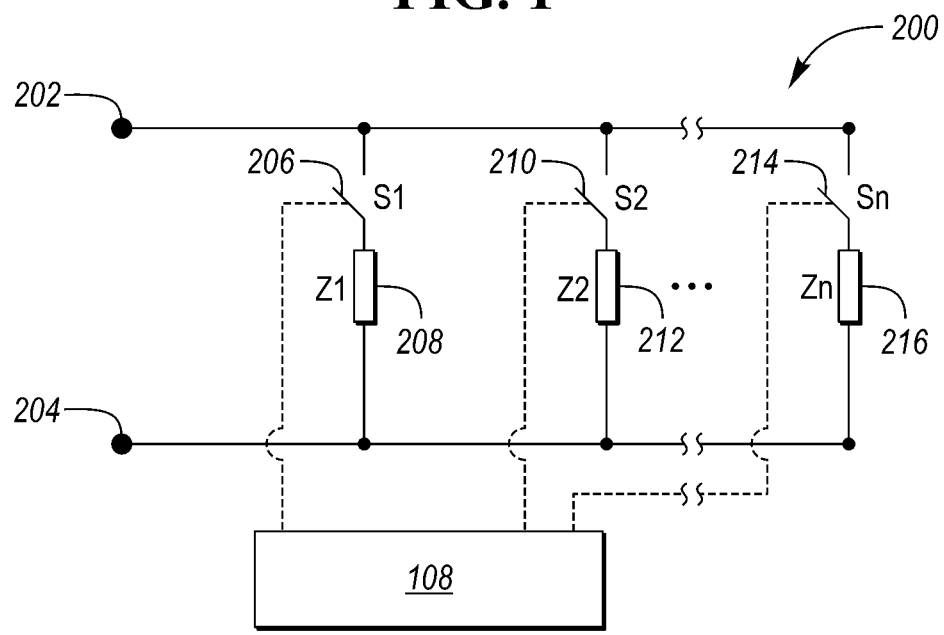
FIG. 2 is a possible configuration of a load bank with a selectable impedance.

The load 112 may be a selectable impedance load or a load bank. FIG. 2 depicts a possible configuration of a load bank 200. The load bank 200 may include a plurality of switching devices and impedances that may be combined to achieve a desired impedance value at the terminals of the load bank 200. The load bank 200 may provide a positive terminal 202 and a return terminal 204 as an electrical interface to other circuit elements. A series combination of a first switching device 206 and a first impedance 208 may be electrically coupled between the positive terminal 202 and the return terminal 204. A series combination of a second switching device 210 and a second impedance 212 may be electrically coupled between the positive terminal 202 and the return terminal 204. The load bank 200 may include any number of similar series combinations coupled between the positive terminal 202 and the return terminal 204. For example, a series combination of an $n^{th}$ switching device 214 and an $n^{th}$ impedance 2216 may be electrically coupled between the positive terminal 202 and the return terminal 204.

The switching devices (e.g., 206, 210, 214) may be relays or solid-state switching devices. The switching devices may have a low impedance when activated (e.g., short circuit) and a high impedance when not activated (e.g., open circuit). The switching devices may form a low impedance conductive path through the switching device when activated. Each of the switching devices of the load bank 200 may include a control signal that is electrically coupled to the controller 108. The controller 108 may operate the control signals to cause the switching devices to electrically connect the associated impedance between the terminals. Operation in this manner allows multiple values of impedance to be selected depending upon the impedance needed for the test.

The impedances (e.g., 208, 212, 216) may be configured to be inductors. The load 200 may have a selectable inductance value. Different inductance values may be selected by activating the corresponding switching devices. In some configurations, one or more of the impedances may be resistive and/or capacitive loads. Note that the example contemplates connecting a variety of impedances in parallel with one another. Some configurations may include similar components that permit selective coupling of impedances in series with one another.

Figure 3:
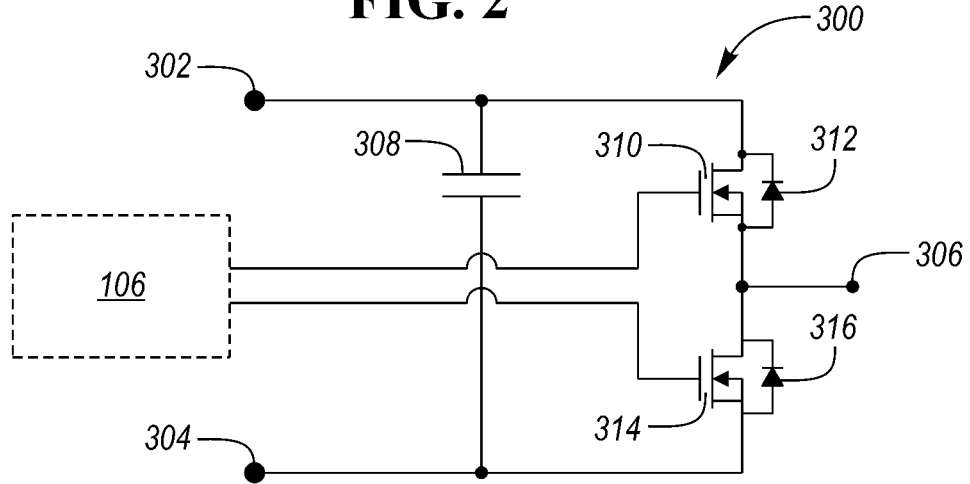
FIG. 3 is a possible configuration of an inverter phase leg.

The test system 100 may be configured to test a variety of circuit configurations. The DUT 102 may be an inverter that is configured to convert a DC input voltage to an AC voltage. For example, the inverter may be used in a vehicle application to drive a three-phase electric machine for propulsion. The DUT 102 may include a half-bridge circuit as may be used in each phase leg of an inverter. FIG. 3 depicts a possible configuration of a DUT 300 that includes a half-bridge circuit. In some configurations, the DUT 300 may include multiple half-bridge circuits (e.g., one for each electric machine phase). The DUT 300 may further include a capacitor 308 that is configured to smooth the voltage that is provided to DUT 300. The capacitor 308 may be electrically coupled between a DUT power terminal 302 and a DUT return terminal 304.

The DUT 300 may include an upper switching element 310 and a lower switching element 314 arranged in a half-bridge configuration. The upper switching element 310 and the lower switching element 314 may be active power semiconductor devices such as power MOSFETs or IGBTs. An upper diode 312 may be electrically coupled across terminals of the upper switching element 310. A lower diode 316 may be electrically coupled across terminals of the lower switching element 314. In some configurations, the upper diode 312 and the lower diode 316 may represent a body diode that is inherent in solid-state switching elements. The DUT 300 may further include additional half-bridge circuits for creating additional outputs. For example, each electric machine phase may have an associated phase leg or half-bridge circuit.

An output terminal 306 may be electrically coupled between terminals of the upper switching element 310 and the lower switching element 314. The output terminal 306 may be one of the inverter phase leg outputs that is normally connected to a phase winding of an electric machine. In a configuration with MOSFET switching elements, the switching elements may be characterized by a drain, source, and gate connections. A drain terminal of the upper switching element 310 may be electrically coupled to the DUT power terminal 302. A source terminal of the upper switching element 310 may be electrically coupled to the output terminal 306 and a drain terminal of the lower switching element 314. A source terminal of the lower switching element 314 may be electrically coupled to the DUT return terminal 304. The upper diode 312 may be electrically coupled between the drain and source terminals of the upper switching element 310 and configured to oppose current flow from the DUT power terminal 302 to the output terminal 306. The lower diode 316 may be electrically coupled between the drain and source terminals of the lower switching element 314 and configured to oppose current flow from the output terminal 306 to the DUT return terminal 304. The gate terminals of the upper switching element 310 and the lower switching element 314 may be electrically coupled to the gate drive circuit 106.

Conventional testing of the elements may utilize the capacitor 308 of the DUT 300 to provide the necessary current to a connected load. In an inverter, an inverter capacitance may be coupled between the DC power input and return terminals. For testing and device characterization purposes, this may require that the capacitor 308 be oversized relative to that needed for normal operation. This may lead to an increased cost of the DUT 300. Other testing configurations may use smaller inductance values for the load impedance to match the capacitor 308 which can impact the turn on/turn off current values. As such, an improved system for characterizing the circuits without affecting the circuit configuration is desired.

In some configurations, the switching elements 310, 314 may be controlled by a controller associated with the DUT 300. For example, the DUT 300 may be an inverter module having multiple phase legs with each inverter phase leg arranged as in FIG. 3. The switching elements 310, 314 may each be controlled by the associated gate input. Gate drive signals for the switching elements 310, 314 may be provided by the associated controller. In addition, conductors for the gate inputs may be made accessible from an external controller (e.g., 106). In other configurations, a communication interface may be provided so that the external controller (e.g., 108) may communicate with the associated controller. The external controller may provide gate commands to the associated controller via the communication link.

Figure 4:
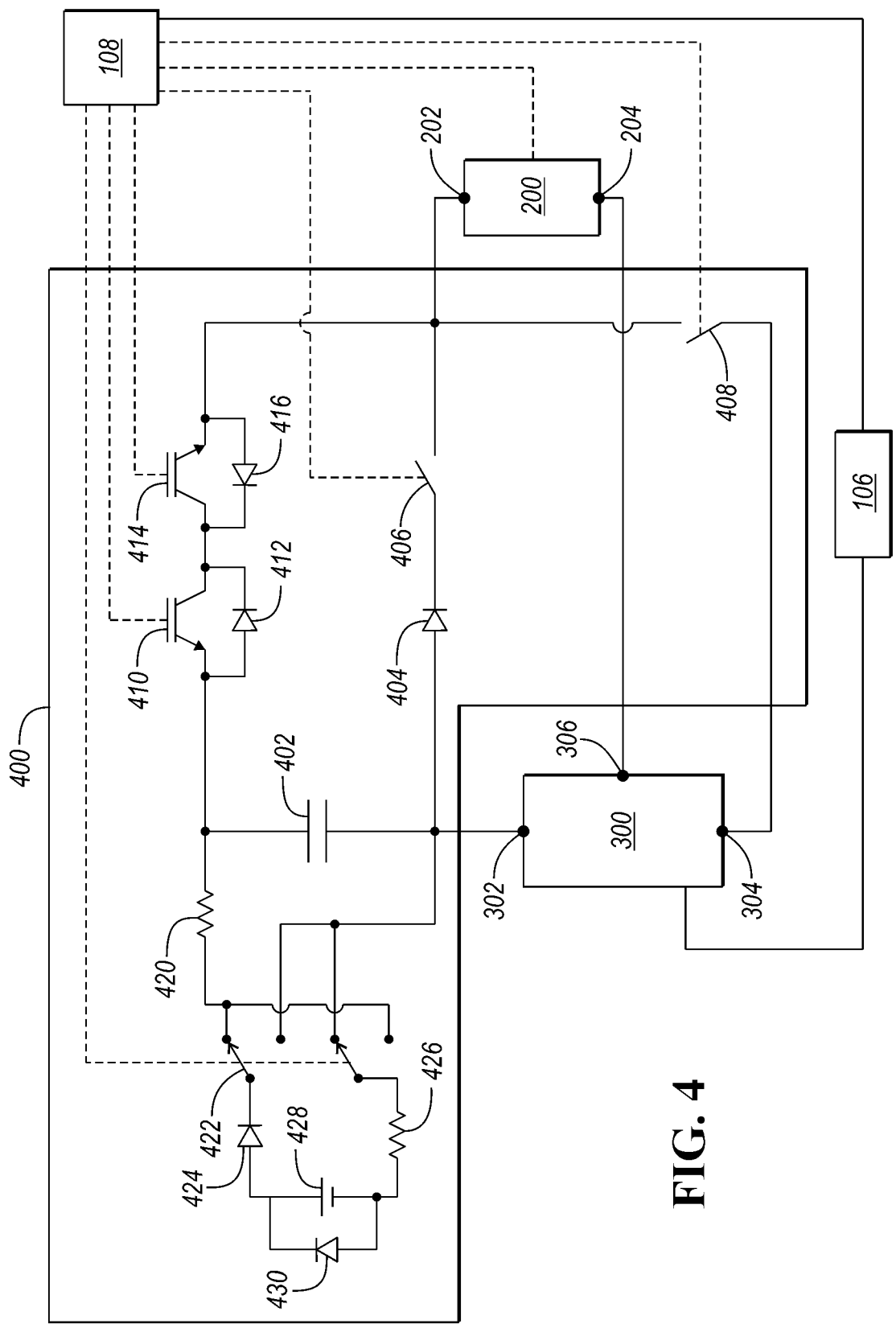
FIG. 4 is a possible configuration of a circuit for testing and characterizing an inverter phase leg.

FIG. 4 depicts a possible configuration of a test system with a circuit for connecting the DUT 300 and the load bank 200 for testing and characterizing the DUT 300. A test circuit 400 may be coupled between the DUT 300 and the load bank 200. The test circuit 400 may include a capacitor 402. One terminal of the capacitor 402 may be electrically coupled to the DUT power terminal 302. When the DUT 300 is an inverter, the capacitor 402 may have a capacitance value that is greater than an inverter capacitance connected across the power and return terminals of the inverter.

The test circuit 400 may be configured to be selectively electrically couple the other terminal of the capacitor 402 to the load bank positive terminal 202. The selective coupling may be implemented as a switch module that is operative to couple the capacitor 402 to a terminal or connection point of the load bank 200. The switch module may be implemented as a solid-state switching elements and associated diodes that are configured to permit current flow through the switch module in a given direction. In the example depicted, IGBTS are used but other types of solid-state switching elements may be used. A first IGBT 410 and a second IGBT 414 may be coupled in a circuit between a first terminal of the capacitor 402 and the load bank positive terminal 202. The first terminal of the capacitor 402 may be electrically coupled to an emitter terminal of the first IGBT 410. A collector terminal of the first IGBT 410 may be electrically coupled to a collector terminal of the second IGBT 414. An emitter terminal of the second IGBT 414 may be electrically coupled to the load bank positive terminal 202. Gate terminals of the first IGBT 410 and the second IGBT 414 may be electrically coupled to the controller 108. A first anti-parallel diode 412 may be electrically coupled across the emitter and collector terminals of the first IGBT 410. The first anti-parallel diode 412 may be configured to resist current flow from the load bank positive terminal 202 to the capacitor 402. A second anti-parallel diode 416 may be electrically coupled across the emitter and collector terminals of the second IGBT 414. The second anti-parallel diode 416 may be configured to resist current flow from the capacitor 402 to the load bank positive terminal 202.

The first IGBT 410 and the second IGBT 414 may be selectively activated by the controller 108 to control the allowed direction of current flow through the capacitor 402. The current flow through the IGBTs and diodes may be determined by the voltage polarity across the switch module. The pair of IGBTS may be arranged such that each of the IGBTs may permit current flow in opposite directions when operated in a conductive state. The controller 108 may include gate driver circuitry for providing the proper gate currents and voltages for actuating the devices. In the configuration depicted, one of the first IGBT 410 and the second IGBT 414 must be operated in the on or conductive state for current to flow through the capacitor 402. The current flow through the switch module may depend upon a polarity of the voltage across the switch module and which of the IGBTs (e.g!, 410, 414) are in the conductive state.

The test circuit 400 may include a diode 404 and a first switching element 406 that are coupled in series between the DUT power terminal 302 and the load bank positive terminal 202. The DUT output terminal 306 may be electrically coupled to the load bank return terminal 204. The first switching element 406 may be a relay. An associated relay solenoid may be electrically coupled to the controller 108. For example, a normally open relay may be used such that the connection is open-circuited when the solenoid is not energized. The relay may create a conductive path between the DUT power terminal 302 and the load bank positive terminal 202 when the solenoid is energized. In some configurations, the first switching element 406 may be a solid-state device.

A second switching element 408 may be electrically coupled between the DUT return terminal 304 and the load bank positive terminal 202. The second switching device 408 may be a relay. An associated relay solenoid may be electrically coupled to the controller 108. The controller 108 may open or close the electrical path between the DUT return terminal 304 and the load bank positive terminal 202 by energizing or de-energizing the associated relay solenoid. In some configurations, the second switching element 408 may be a solid-state device.

The capacitor 402 may be selectively charged such that the voltage polarity across the capacitor 402 may be selected. A capacitor supply network may be configured to selectively apply a voltage across the capacitor 402 to charge the capacitor 402. The capacitor supply network may include a high-voltage power supply 428 which may be a high-voltage DC power supply. The voltage level of the high-voltage power supply 428 may be variable. A switch 422 may be configured to selectively connect the high-voltage power supply 428 across the capacitor 402. The switch 422 may be a double-pole, double-throw (DPDT) electro-mechanical switch. Note that the switch 422 may also be comprised of solid-state switching elements arranged to implement similar functionality. The switch 422 may be electrically actuated to place the switch contacts in a first position or a second position. In the first position, the switch 422 may connect the high-voltage power supply 428 across the capacitor 402 with a first polarity. In the second position, the switch 422 may connect the high-voltage power supply 428 across the capacitor 402 with a second polarity. A control signal for the switch 422 may be electrically connected to the controller 108 that may drive the control signal to select the switch position.

The capacitor supply network may include a first diode 424 electrically coupled between a positive terminal of the high-voltage power supply 428 and a first input terminal of the switch 422. The first diode 424 may be configured to allow current flow from the high-voltage power supply 428 to the switch 422, but not in the reverse direction. The capacitor supply network may include a second diode 430 that is coupled across the high-voltage power supply 428. The capacitor supply network may include a first resistance 426 that is electrically coupled between a return terminal of the high-voltage power supply 428 and a second input terminal of the switch 422. The capacitor supply network may include a second resistance 420 that is coupled between the capacitor 402 and a terminal of the switch 422. The first resistance 426 and the second resistance 420 may be configured to limit a flow of current from the high-voltage power supply 428. The high-voltage power supply 428 may have a selectable voltage and current capability such that different voltages may be applied across the capacitor 402.

In the first position, the switch 422 may electrically couple the high-voltage power supply 428 across the capacitor 402 with a first polarity. In the second position, the switch 422 may electrically couple the high-voltage power supply 428 across the capacitor with a second polarity. The controller 108 may select the position of the switch 422 based on the test sequence to be performed. The switch 422 may be operative to select a polarity of a voltage across the capacitor 402. In some configurations, a high-voltage power source (e.g., battery) may be coupled across the DUT power terminal 302 and the DUT return terminal 304.

The test circuit 400 and load bank 200 may be utilized to test and characterize the active (e.g., MOSFET, IGBT) and passive components (e.g., diodes) of the DUT 300. For example, dynamic switching characterization may be evaluated using a double pulse test. The test circuit 400 may be operated to control voltages and currents of the DUT 300. The test circuit 400 may be operated to perform static tests (e.g., single-pulse test or I-V test), dynamic tests (e.g., double-pulse test), short circuit tests (e.g., shoot-through test), and breakdown tests (e.g., static and dynamic breakdown tests).

The controller 108 may be configured to interface with the switch module (first IGBT 410 and second IGBT 414), the switch 422, the pair of switching elements (406, 408), and an inverter under test (e.g., 300) to selectively control a flow of current through active and passive elements of an inverter phase leg to which the circuit is connected. The controller 108 may be configured to operate the pair of switching elements (406, 408) such that no more than one is closed at a given time to prevent shorting the DUT power terminal 302 to the DUT return terminal 304. The controller 108 may be configured to selectively couple the load 200 between the output terminal 306 and one of the DUT power terminal 302 and the DUT return terminal 304 by operation of the pair of switching elements (406, 408). The controller 108 may be configured to selectively charge the capacitor 402 by operating the switch 422. The controller 108 may be configured to selectively couple the capacitor 402 to the load 200 by operation of first IGBT 401 and the second IGBT 414 of the switch module.

The controller 108 may be configured to interface with the inverter phase leg to control a path of current flow through active and passive elements of the inverter phase leg. The controller 108 may be configured to interface with the device under test to operate the active elements of the inverter phase leg during a test cycle. For example, the controller 108 and the DUT 300 may be designed such that the controller 108 may provide or otherwise control the associated gate signals to the active elements of the DUT 300. In some configurations, the controller 108 may communicate with the DUT 300 through a communication interface to drive the gate signals.

The test circuit 400 may further include voltage sensors to measure the voltage at predetermined locations of the circuit. For example, a voltage sensor may be included to measure a voltage across the capacitor 402. The voltage sensor may be a high-impedance resistive network coupled across a component. A voltage sensor may be included to measure the voltage across the load 200. The test circuit may further include current sensors to measure the current flowing through predetermined paths of the circuit. For example, a current sensor may be included to measure a current flowing through the load 200. Types of current sensors that may be used include a Hall-effect type sensor and/or a current shunt. The voltage and current sensors may provide signals to the controller 108. The test circuit 400 may include any scaling and isolation elements for handling the sensor signals. The controller 108 may be programmed to read and process the sensor signals. The sensor signals may be utilized for control purposes and/or may be stored for later analysis and computation.

The DUT 300 may include voltage and current sensors that report voltage and current measurements to an associated controller. The DUT 300 may be configured to provide the voltage and current signals to an external interface for use by the controller 108. In some configurations, the voltage and current sensors may be provided by the DUT associated controller and sent to the controller 108 via a communication link. By using sensors internal to the DUT 300, sensors may be excluded from the test circuit 400.

The controller 108 may be programmed to perform a variety of test cycles under a variety of conditions. For example, the controller 108 may perform test cycles with varying impedance values of the load 200. The controller 108 may perform test cycles at different voltages by adjusting the voltage level of the high-voltage power source 428. Different test cycles may be performed by operating the switch module, the switch 422, the pair of switching elements (406, 408), and an inverter under test (e.g., 300) in different sequences. The controller 108 may be configured to collect voltage and current data for analysis. The controller 108 may include non-volatile memory for data storage.

An example of using the circuit in a test cycle may be for conducting a double pulse test for evaluating the dynamic switching characteristics of the DUT 300. The test cycle assumes that the load 200 is an inductive load. The switch 422 may be operated to apply a voltage to the capacitor 402. The switch 422 may be operated to cause a voltage polarity across the capacitor 402 such that the terminal of the capacitor 402 that is connected to the switch module (e.g., first IGBT 410) has a higher potential than the DUT power terminal 302. A next phase of operation may include closing the first switching element 406 and activating the second IGBT 414. In this phase, current may flow from the capacitor 402, through the first anti-parallel diode 412, through the second IGBT 414, through the load 200 to the output terminal 306. Within the DUT 300, the current may flow through the upper diode 312 to the DUT power terminal 302 to complete the circuit. This causes current to flow through the load 200.

The next phase of operation may be to deactivate the second IGBT 414 which stops current flow from the capacitor 402 to the load 200. The load 200, being inductive, will try to maintain the current flow. The voltage polarity across the load 200 may reverse to maintain the current flow. The current path in this phase may be through the upper diode 312, through the first switching element 406 and through the load 200.

The next phase of operation may be to modulate the lower switching element 314 to cause current to flow from the load 200 through the lower switching element 314, through the DUT capacitance (e.g., 308) to the DUT power terminal 302 and through the first switching element 406. The lower switching element 314 may be modulated on and off to cause the current path to alternate. This allows active device characterization to be performed.

Another example of using the circuit in a test cycle may be for conducting a double pulse test for passive device characterization. The switch 422 may be operated to apply a voltage to the capacitor 402. The switch 422 may be operated to cause a voltage polarity such that the connection between the capacitor 402 and the switch module has a lower potential than the DUT power terminal 302. A next phase of operation may include closing the second switching element 408, activating the first IGBT 410, and activating the upper switching element 310 of the DUT 300. In this phase, current may flow from the capacitor 402 to the DUT power terminal 302, through the upper switching element 310, through the load, through the second anti-parallel diode 416, and through the first IGBT 410 to the capacitor 402.

The next phase of operation may be to deactivate the first IGBT 410 and deactivate the upper switching element 310 of the DUT 300. In this phase, the current may be flowing from the load 200, through the second switching element 408, through the lower diode 316 of the DUT 300 back to the load 200. The voltage polarity of the load 200 may reverse to maintain the current flow.

The next phase of operation may be to modulate the upper switching element 310 of the DUT 300 on and off. When the upper switching element 310 is in the on state, the current may flow through the load 200, through the second switching device 408, through the DUT capacitance to the DUT power terminal 302, and through the upper switching element 310 to the load 200. As the upper switching element 310 is modulated, current flow will alternate between the upper switching element 310 and the lower diode 316. This allows passive device characterization to be performed.

The above are examples of using the circuit to characterize devices of an inverter phase leg. Other modes of operation may be possible and may be achieved by programming the controller 108 accordingly. The system allows for characterization of an inverter phase leg that is part of a manufactured assembly. The circuit may be configured to easily connect to an inverter to test each phase leg. For example, the circuit may be configured to have matching connectors for coupling the circuit to an inverter. This allows characterization of the devices in the final product.

The processes, methods, or algorithms disclosed herein can be deliverable to/implemented by a processing device, controller, or computer, which can include any existing programmable electronic control unit or dedicated electronic control unit. Similarly, the processes, methods, or algorithms can be stored as data and instructions executable by a controller or computer in many forms including, but not limited to, information permanently stored on non-writable storage media such as ROM devices and information alterably stored on writeable storage media such as floppy disks, magnetic tapes, CDs, RAM devices, and other magnetic and optical media. The processes, methods, or algorithms can also be implemented in a software executable object. Alternatively, the processes, methods, or algorithms can be embodied in whole or in part using suitable hardware components, such as Application Specific Integrated Circuits (ASICs), Field-Programmable Gate Arrays (FPGAs), state machines, controllers or other hardware components or devices, or a combination of hardware, software and firmware components.

While exemplary embodiments are described above, it is not intended that these embodiments describe all possible forms encompassed by the claims. The words used in the specification are words of description rather than limitation, and it is understood that various changes can be made without departing from the spirit and scope of the disclosure. As previously described, the features of various embodiments can be combined to form further embodiments of the invention that may not be explicitly described or illustrated. While various embodiments could have been described as providing advantages or being preferred over other embodiments or prior art implementations with respect to one or more desired characteristics, those of ordinary skill in the art recognize that one or more features or characteristics can be compromised to achieve desired overall system attributes, which depend on the specific application and implementation. These attributes may include, but are not limited to cost, strength, durability, life cycle cost, marketability, appearance, packaging, size, serviceability, weight, manufacturability, ease of assembly, etc. As such, embodiments described as less desirable than other embodiments or prior art implementations with respect to one or more characteristics are not outside the scope of the disclosure and can be desirable for particular applications.

What is claimed is:

1. A circuit comprising:
   a capacitor coupled between an inverter power input and a switch module operative to couple the capacitor to a first terminal of a load having a second terminal coupled to an inverter phase output;
   a switch operative to select a polarity of a voltage across the capacitor; and
   switching elements operative to selectively couple the first terminal to each and only one of the inverter power input and an inverter power return.

2. The circuit of claim 1 wherein the switch module includes a pair of Insulated Gate Bipolar Transistors (IGBT) that are arranged to, responsive to being in a conductive state, permit current flow in opposite directions.

3. The circuit of claim 1 wherein the switching elements are a pair of relays.

4. The circuit of claim 1 further comprising a controller configured to interface with the switch module, the switch, the switching elements, and an inverter under test to selectively control a flow of current through active and passive elements of an inverter phase leg to which the circuit is connected.

5. The circuit of claim 4 wherein the controller is configured to operate the switching elements such that no more than one of the switching elements is closed at a time.

6. The circuit of claim 4 wherein the controller is further configured to interface with the inverter under test to operate active elements of the inverter phase leg during a test cycle.

7. The circuit of claim 1 wherein the capacitor has a capacitance value greater than an inverter capacitance across the inverter power input and the inverter power return.

8. The circuit of claim 1 wherein the load is configured to have a selectable inductance.

9. The circuit of claim 1 further including a diode electrically coupled between the inverter power input and one of the switching elements.

10. A system for testing an inverter phase leg having output, power, and return terminals comprising:
a load coupled to the output terminal; and
a controller configured to selectively couple the load to each and only one of the power terminal and the return terminal, selectively charge and couple a capacitor to the load, and interface with the inverter phase leg to control a current path through active and passive elements of the inverter phase leg, wherein the controller is configured to drive a pair of Insulated Gate Bipolar Transistors (IGBTs) that are coupled between a terminal of the capacitor and the load such that each of the pair of IGBTs is configured to permit current flow in opposite directions when driven to a conductive state.

11. The system of claim 10 wherein the controller is configured to drive a relay that is electrically coupled between the power terminal and a terminal of the load.

12. The system of claim 10 wherein the controller includes a relay electrically coupled between the return terminal and a terminal of the load.

13. The system of claim 10 wherein the controller is further configured to selectively connect a voltage source to adjust a voltage polarity with which the capacitor is charged.

14. The system of claim 10 wherein the load is configured to have a selectable inductance and the controller is further configured to select an inductance value.

15. A circuit for testing an inverter phase leg having output, power, and return terminals comprising:
a capacitor;
a switch circuit coupling the capacitor to a first terminal of a load having a second terminal coupled to the output terminal;
a switch operative to select a polarity of a voltage connected across the capacitor; and
a pair of switches operative to selectively couple the first terminal to the power and return terminals.

16. The circuit of claim 15 wherein the capacitor has a capacitance value greater than an inverter capacitance connected across the power and return terminals internal to the inverter phase leg.

17. The circuit of claim 15 wherein the load is configured to have a selectable inductance.

18. The circuit of claim 15 wherein the switch circuit includes a pair of Insulated Gate Bipolar Transistors (IGBT) configured to permit current flow in opposite directions when activated.

19. The circuit of claim 15 further comprising a controller configured to interface with the switch circuit, the switch, the pair of switches, and the inverter phase leg to selectively control a flow of current through active and passive elements of the inverter phase leg to which the circuit is connected.

* * * * *